(12) United States Patent
Chan et al.

(10) Patent No.: US 7,932,669 B2
(45) Date of Patent: Apr. 26, 2011

(54) SYSTEM FOR DISPLAYING IMAGES AND FABRICATION METHOD THEREOF

(75) Inventors: Chuan-Yi Chan, Taipei (TW); Du-Zen Peng, Jhubei (TW)

(73) Assignee: Chimei Innolux Corporation, Miao-Li County (TW)

( * ) Notice: Subject to any disclaimer, the term of this patent is extended or adjusted under 35 U.S.C. 154(b) by 293 days.

(21) Appl. No.: 12/147,888

(22) Filed: Jun. 27, 2008

(65) Prior Publication Data

US 2009/0021152 A1 Jan. 22, 2009

(30) Foreign Application Priority Data

Jul. 19, 2007 (TW) ................................ 96126322 A

(51) Int. Cl.
*H01J 1/62* (2006.01)
(52) U.S. Cl. ........................................ 313/504; 313/506

(58) Field of Classification Search ................. 313/504, 313/506, 509, 512
See application file for complete search history.

(56) References Cited

U.S. PATENT DOCUMENTS

2007/0170857 A1* 7/2007 Choi et al. .................... 313/512

* cited by examiner

*Primary Examiner* — Vip Patel
(74) *Attorney, Agent, or Firm* — Tim Tingkang Xia; Morris, Manning & Martin, LLP

(57) ABSTRACT

The invention provides a system for displaying image and a fabrication method thereof. The system comprises an organic electroluminescent display device comprising a first substrate divided into a pixel region and a non-pixel region, a conductive layer formed in the non-pixel region, a second substrate corresponding to the first substrate, a first electrode formed on the second substrate, an organic electroluminescent layer formed on the first electrode, and a second electrode formed on the organic electroluminescent layer and electrically connected to the conductive layer. The system further includes an exterior circuit electrically connected to the conductive layer for transmitting signals.

14 Claims, 4 Drawing Sheets

SYSTEM FOR DISPLAYING IMAGES AND FABRICATION METHOD THEREOF

CROSS REFERENCE TO RELATED APPLICATIONS

This application is based upon and claims the benefits of priority from Taiwan Patent Application No. 096126322, filed on Jul. 19, 2007, the entire contents of which are incorporated herein by reference.

BACKGROUND OF THE INVENTION

1. Field of the Invention

The invention relates to a system for displaying images, and more particularly to an image display system comprising an organic electroluminescent display (OELD) device having an improved conductive path for signals and a fabrication method thereof.

2. Description of the Related Art

With the popularity of electronic devices, display system requirements accordingly increase. Organic electroluminescent displays (OELD) are widely used in electronic devices, for example mobile phones, car navigation systems (CNS), personal digital assistants (PDA) and camcorders, because of its advantages such as lower power consumption, relatively higher brightness and relatively rapid response time.

FIG. 1 is a cross-sectional view of a conventional organic electroluminescent display device. In FIG. 1, a substrate 2 having an array of thin film transistors (TFTs) 4 and a bonding pad 8 formed thereon is provided. Then, an anode electrode 6 and a pixel define layer (PDL) 10 is sequentially formed on the substrate 2 and the pixel define layer 10 covers the bonding pad 8. A contact hole 12, also referred to as a cathode contact hole, is formed to expose the bonding pad 8. A cathode electrode 14 is then formed on the substrate 2 and electrically connects to the exposed bonding pad 8 to transmit an exterior signal to the cathode electrode 14. Because the contact hole 12 has an extreme depth (namely thickness of the pixel define layer 10), the cathode electrode 14 formed on the sidewalls of the contact hole 12 is easily damaged, resulting in an inability to for the cathode electrode 14 to receive an exterior signal. A technique has been developed to avoid damage of the cathode electrode 14, where an indium tin oxide (ITO) layer serving as an auxiliary cathode (not shown) is formed on the cathode electrode 14. The indium tin oxide layer, however, has relatively higher resistance, resulting in relatively higher voltage drop and poorer display quality.

Thus, an organic electroluminescent display device and fabrication method thereof ameliorating the described problems is needed.

BRIEF SUMMARY OF INVENTION

Accordingly, the invention provides a system for displaying image. An exemplary embodiment of the system comprises an organic electroluminescent display device which includes: a first substrate divided into a pixel region and a non-pixel region; a conductive layer formed on the non-pixel region of the first substrate; a second substrate disposed corresponding to the first substrate; a first electrode formed on the second substrate; an organic electroluminescent layer formed on the first electrode; and a second electrode formed on the organic electroluminescent layer and electrically connected to the conductive layer. Moreover, the system further comprises an exterior circuit which electrically connects the conductive layer in the non-pixel region. In the organic electroluminescent display device, because a signal can be transmitted from the exterior circuit to second electrode via the conductive layer formed on the first substrate, a contact hole (also cathode contact hole) is not required. Thus, damage of the second electrode is eliminated. Accordingly, extra steps for forming the contact hole are not needed, thus, fabrication costs are reduced.

Also, the invention provides a method for fabricating an image display system comprising an organic electroluminescent display device, in which the organic electroluminescent display device is fabricated by steps including: providing a first substrate including a pixel region and a non-pixel region; forming a conductive layer in the non-pixel region of the first substrate; disposing a second substrate corresponding to the first substrate; forming a first electrode on the second substrate; forming an organic electroluminescent layer on the first electrode; and forming a second electrode on the organic electroluminescent layer and electrically connected to the conductive layer. The method further comprises providing an exterior circuit electrically connected to the conductive layer formed on the first substrate in the non-pixel region.

The invention provides a method for operating an image display system comprising an organic electroluminescent display device and an exterior circuit, in which the organic electroluminescent display comprises a first substrate having a color filter layer and a conductive layer thereon, and a second substrate having a first electrode, an organic electroluminescent layer and a second electrode thereon, which is disposed corresponding to the first substrate. The operation method comprises: providing a first signal to the first electrode; transmitting a second signal from the exterior circuit to the conductive layer on the first substrate; transmitting the second signal from the conductive layer to the second electrode on the second substrate; and controlling the organic electroluminescent layer to emit light.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The following description is of the embodiments of carrying out the invention. This description is made for the purpose of illustrating the general principles of the invention and should not be taken in a limiting sense. The scope of the invention is best determined by reference to the appended claims.

The invention will be described with respect to a preferred embodiment, namely a top emission organic electroluminescent display device. The invention may also be applied, however, to manufacturing any other organic electroluminescent display device such as a bottom emission organic electroluminescent display device.

Figure 1:
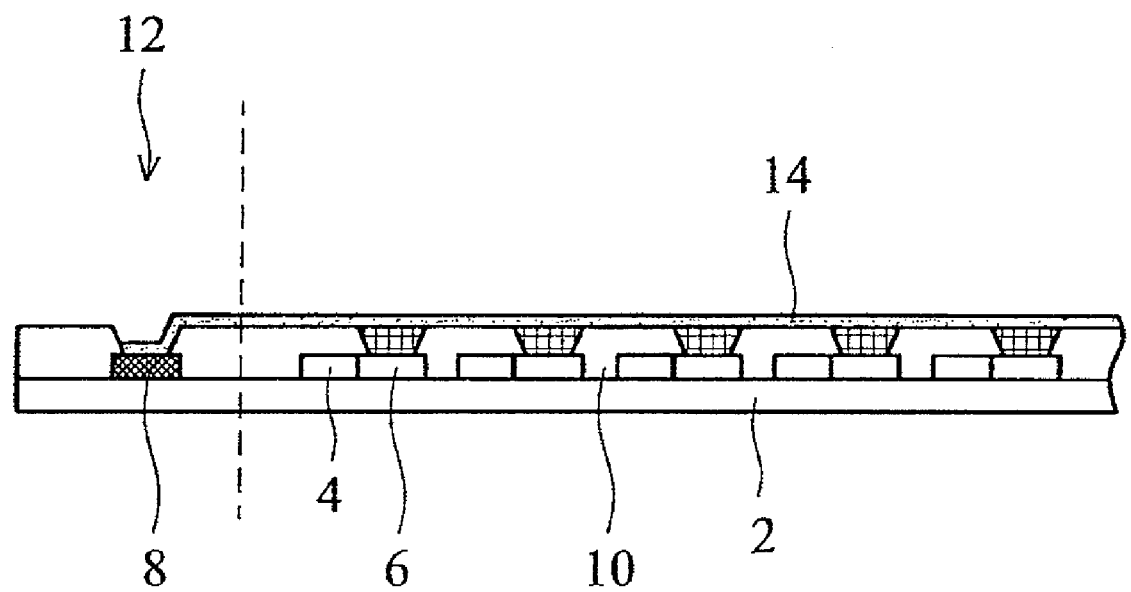
FIG. 1 is a cross-sectional view of a conventional organic electroluminescent display device.
Figure 2A:
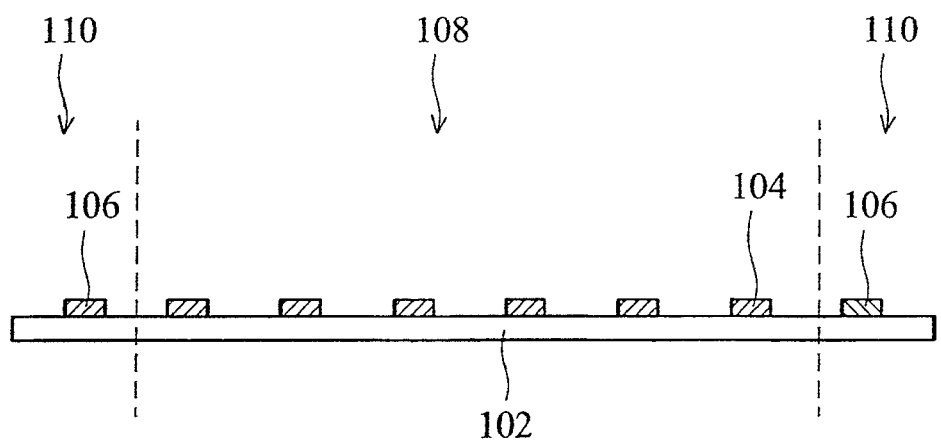
FIG. 2A-2E are schematic views illustrating a method for fabricating an organic electroluminescent display device according to an embodiment of the invention.

FIGS. 2A through 2E are schematic views illustrating a method for fabricating an organic electroluminescent display device. Referring to FIG. 2A, a first substrate 102 is provided with a black matrix (BM) 104 and a conductive layer 106 formed thereon. In some embodiments, a layer (not shown) is conformally deposited on the first substrate 102 such as glass, plastic or any other suitable transparent substrate, by, for example sputtering, evaporating or any other suitable manner. Next, the black matrix 104 and the conductive layer 106 are simultaneously formed, following patterning of the layer by a photolithographic and etching process. Preferably, the black matrix 104 and the conductive layer are made of a material such as chromium (Cr), aluminum (Al), nickel (Ni) or any other suitable conductive materials. In the example, both the black matrix and the conductive layer can be simultaneously formed. Thus, fabrication steps are simplified and costs are also reduced. Specifically, the conductive material for the black matrix can be utilized to form the conductive layer during formation of the black matrix, thus, extra material and steps are not required.

Although simultaneous formation of the black matrix 104 and the conductive layer 106 in above embodiment is preferred, the black matrix 104 and the conductive layer 106, however, may also be independently and separately fabricated. In one embodiment, a layer (not shown) is formed by spin coating, sputtering, evaporating or any other suitable manners followed by patterning the layer to form the black matrix 104. Next, a conductive material layer (not shown) is formed on the first substrate 102 followed by patterning the conductive material layer to form the conductive layer 106. It is appreciated that the conductive layer may also be formed prior to the black matrix in this example.

The black matrix 104, also referred to as a shielding layer, is preferably made of a metal material such as chromium (Cr) or nickel (Ni), or a nonmetal material such as black resin to prevent the organic electroluminescent display device from light leakage. Preferably, the conductive layer 106 is made of a material such as chromium, aluminum (Al), nickel (Ni) or any other suitable conductive materials.

In FIG. 2A, the first substrate 102 is divided into a pixel region 108 and a non-pixel region 110 by the black matrix 104 and the conductive layer 106. Specifically, the black matrix 104 is formed in the pixel region 108 of the first substrate 102 to prevent the organic electroluminescent display device from light leakage, and increase contrast of organic electroluminescent display device. The conductive layer 106 is formed in the non-pixel region 110 of the first substrate 102, and serves as a conductive path for transmitting signals. The pixel region 108 may also be referred to as a display region and the non-pixel region 110 as a non-display region.

Figure 2B:
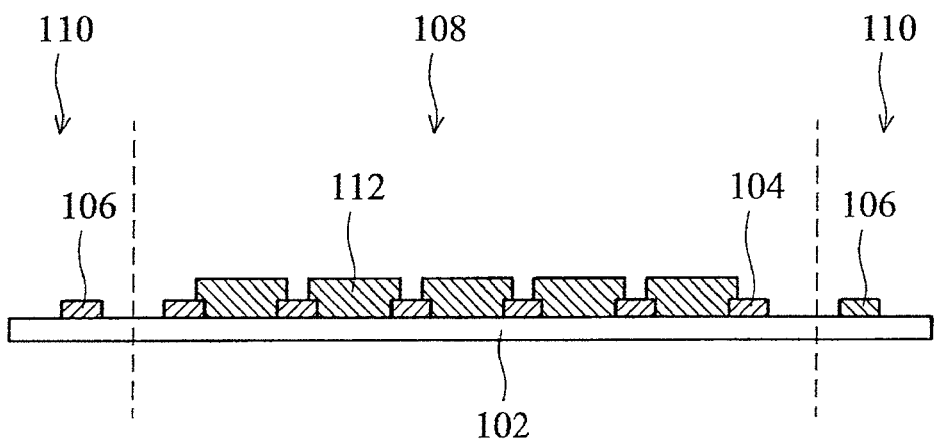

Referring to FIG. 2B, a color filter layer 112 is formed on the first substrate 102. In some embodiments, a color pigment such as blue, red or green is formed in the pixel region 108 by spin coating followed by a photolithographic and etching process to form the color pigment between the black matrices 104. The steps are repeatedly executed to form the color filter layer 112. Alternatively, the color filter layer 112 on the first substrate 102 may also be formed by inkjet printing. Accordingly, the first substrate is also referred to as a color filter substrate.

Figure 2C:
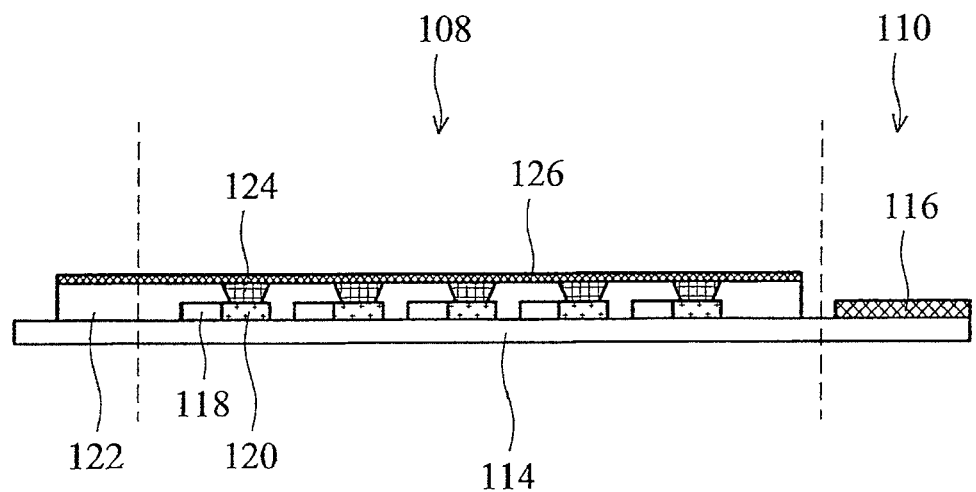

Referring to FIG. 2C, a second substrate 114, an array of thin film transistors (TFTs) 118 formed thereon, is provided. The second substrate 114 may also be divided into the pixel region 108 and the non-pixel region 110 as the first substrate 102. A bonding pad 116 is then formed on the second substrate 114 and in the non-pixel region 110 to transmit a signal from an exterior circuit to the organic electroluminescent display device.

A first electrode 120 is then formed on the second substrate 114 and is electrically connected to the thin film transistor 118. Preferably, the first electrode 120 is made of a transparent conductive layer such as indium tin oxide (ITO). A pixel define layer (PDL) 122 is thereafter formed on the second substrate 114 to define the pixel area, and expose the first electrode 120. In some embodiments, a layer (not shown) is deposited on the second substrate 102 followed by patterning of the layer to form the pixel define layer 122 and expose the first electrode 120.

In FIG. 2C, an organic electroluminescent layer 124 is formed in the pixel define layer 122 and electrically connects to the exposed first electrode 120. In one embodiment, the organic electroluminescent layer 124 may be a stack layer including a blue emitting layer, a red emitting layer and a green emitting layer, or be a blue emitting layer doped as a yellow emitting layer (or red emitting layer), and formed by vacuum evaporation to be provided as a white light source for the electroluminescent display device.

Next, a second electrode 126 is formed on the second substrate 114 and covers the organic electroluminescent layer 124. Preferably, the second electrode 126 is made of a material such as aluminum, aluminum-lithium alloy or magnesium-sliver alloy and formed by sputtering, electron beam evaporation or thermal evaporation.

Note that the first electrode 120, the organic electroluminescent layer 124 and the second electrode 126 constitute an organic electroluminescent unit, in which the first electrode 120 serves as an anode and the second electrode 126 as a cathode. It is appreciated that an antireflective layer (not shown) is optionally formed underlying the first electrode 120 to reflect light produced by the organic electroluminescent layer 124 and improve luminous efficiency of the organic electroluminescent display device.

Figure 2D:
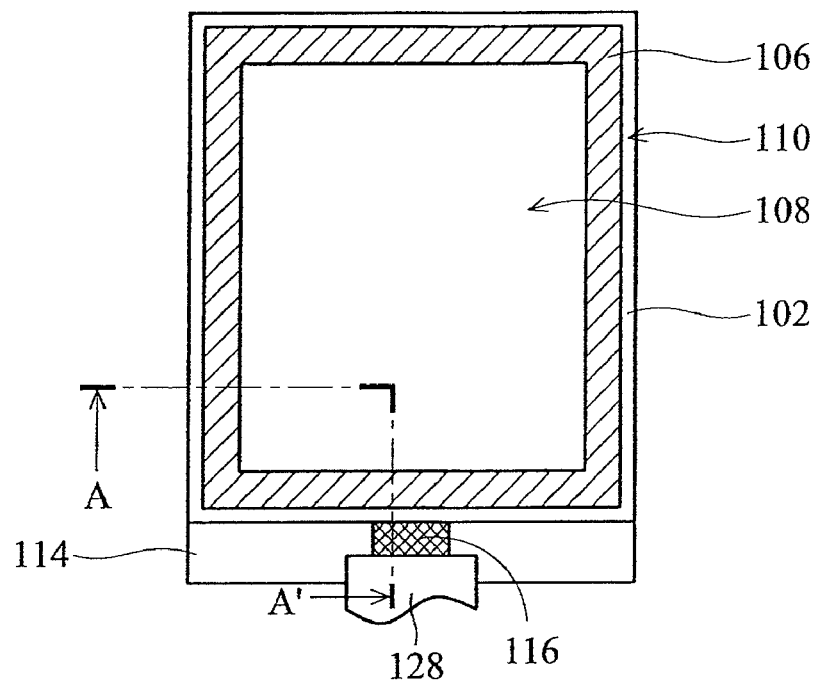

Referring to FIG. 2D, the first substrate 102 is correspondingly disposed on the second substrate 114. A flexible printed circuit (FPC) 128 is then electrically connected to the bonding pad 116 on the second substrate 114, thereby providing a signal to the organic electroluminescent display device. In FIG. 2D, the conductive layer 106 is formed in the non-pixel region 110 and surrounds the pixel region 108.

Figure 2E:
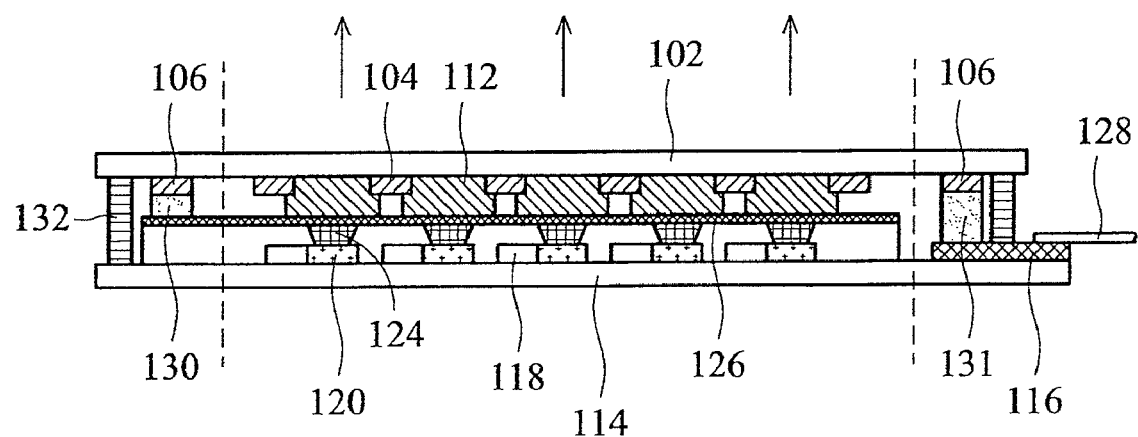

FIG. 2E is a cross-sectional view along a line from A to A' of the organic electroluminescent display device illustrated in FIG. 2D. In FIG. 2E, a first conductive member 130 and a second conductive member 131 are formed between the first substrate 102 and the second substrate 114. In some embodiments, a conductive resin such as conductive epoxy resin, or a coating capable of conductivity such as furfuryl alcohol conductive resin coating, is coated on the conductive layer 106. Next, the first substrate 102 and the second substrate 114 are bonded and then sealed by a sealant 132, and the first conductive member 130 and the second conductive member 131 are formed therebetween whereby the first conductive member 130 electrically connects the conductive layer 106 to the second electrode 126 and the second conductive member 131 electrically connects the conductive layer 106 to the bonding pad 116. Thus, fabrication of the organic electroluminescent display device 140, as shown in FIG. 2E, is complete. In the embodiment, a resin containing a plurality of conductive particles such as sliver powder dispersed therein can be used as the conductive resin.

In some embodiments, the first conductive member 130 and the second conductive member 131 may be made of an adhesive resin containing a plurality of conductive particles, for example an anisotropic conductive film (ACF). In the example, the ACF is coated on the conductive layer 106, thereby sealing the first substrate 102 and the second substrate 114 to form the first conductive member 130 and the second conductive member 131 therebetween. Because the first conductive member 130 and the second conductive member 131 are capable of adhesion and conductivity, the first substrate 102 and the second substrate 114 are sealed without the sealant 132. Thus, fabrication costs are reduced.

In the organic electroluminescent display device, the first conductive member 130 electrically connects the conductive layer 106 and the second electrode 126, and the second conductive member 131 electrically connects the conductive layer 106 and the bonding pad 116. Accordingly, a signal from the flexible printed circuit 128 to the bonding pad 116 is transmitted to the conductive layer 106 on the first substrate 102 by the second conductive member 131. Meanwhile, the signal is in the non-pixel region 110 of the organic electroluminescent device 140, surrounds the pixel region 108 and is transmitted to the second electrode 126 formed on the second substrate 114 by the first conductive member 130.

FIG. 2E is a cross-sectional view of an organic electroluminescent display device 140 according to an embodiment of the invention. In FIG. 2E, a first substrate 102, also referred to as a color filter substrate, is provided with a color filter layer 112 and a black matrix 104 formed thereon. A conductive layer 106 is formed on the first substrate 102 for transmitting signals. A second substrate 114, also referred to as a TFT array substrate, is provided with an array of thin film transistors (TFTs) 118 formed thereon. The first substrate 102 is correspondingly disposed on the second substrate 114. Additionally, a first electrode, electrically connected with the thin film transistor 118, an organic electroluminescent layer 124 and a second electrode 126 are sequentially formed on the second substrate 114. A bonding pad 116 is formed on the second substrate 114 and is electrically connected to a flexible printed circuit 128. A first conductive member 130 and a second conductive member 131 are formed between the first substrate 102 and the second substrate 114, in which the first conductive member 130 is electrically connected the conductive layer 106 formed on the first substrate 102 and the second electrode 126 formed on the second substrate 114, and the second conductive member 131 electrically connects the conductive layer 106 and the bonding pad 116.

During operation of the organic electroluminescent display device 140, a first signal is transmitted from the thin film transistor 118 to the first electrode 120. Meanwhile, a second signal is transmitted from the flexible printed circuit 128 to the bonding pad 116. Next, the second signal is transmitted from the bonding pad 116 to the conductive layer 106 formed on the first substrate 102 via the second conductive member 131, and the second signal surrounds the pixel region along the conductive layer 106. Thereafter, the second signal is transmitted from the conductive layer 106 to the second electrode 126 formed on the second substrate 114 via the first conductive member 130. The organic electroluminescent layer 124 is controlled by the first signal from the first electrode 120 and the second signal from the second electrode 126 to emit light, as the arrows shown in FIG. 2E. Accordingly, the organic electroluminescent display device can display images.

In the organic electroluminescent display device according to an embodiment of the invention, a signal path for the cathode (second electrode) is located on the color filter substrate (first substrate). A cathode contact hole utilized to transmit the signal to the cathode (formed on TFT substrate or second substrate) is not required. Thus, cathode damage caused by the cathode contact hole is eliminated and fabrication yield is improved. Moreover, the signal path for the cathode is located on the color filter substrate, thus, fabrication of the organic electroluminescent display device is more flexible and utilization efficiency of panels is also increased. Furthermore, transmitting the signal and avoiding the cathode damage are approaches without requiring extra steps for forming the cathode contact hole and extra elements such as an auxiliary cathode. Thus, fabrication costs are reduced.

Figure 3:
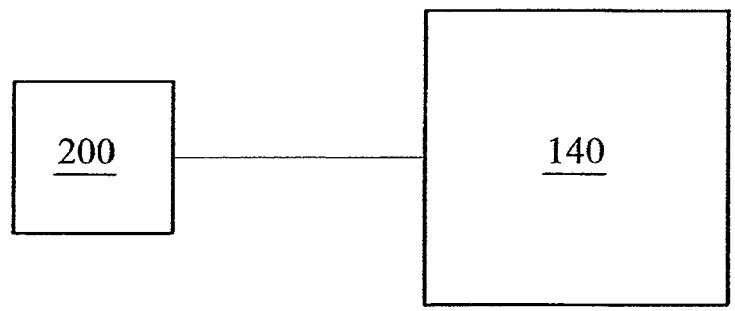
FIG. 3 is a schematic view illustrating an image display system which comprises an organic electroluminescent display device, according to an embodiment of the invention.

FIG. 3 is a schematic view of an image displaying system 300 which includes an organic electroluminescent display device 140 according to an embodiment of the invention, in which the organic electroluminescent display device 140 may be a part of an electronic device. In FIG. 3, the image displaying system 300 further includes an input unit 200 coupled with the organic electroluminescent display device 140, by which a signal can be received to control the organic electroluminescent display device 140 for displaying image. Preferably, the image display system is an electronic device, for example mobile phones, digital cameras, personal digital assistants (PDAs), notebook computers, desktop computers, televisions, automobile monitors, global positioning systems (GPS), fight displays or portable digital video disc players.

Figure 4:
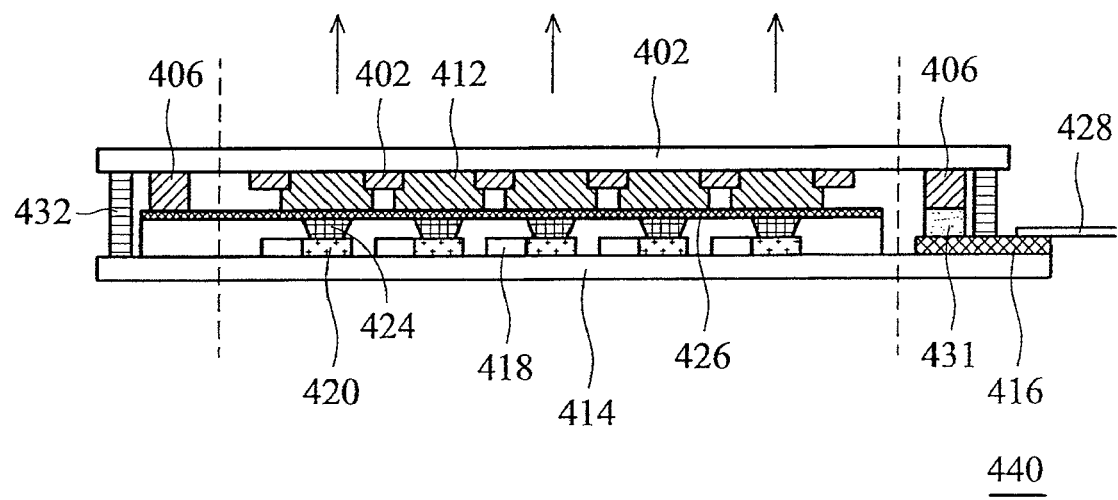
FIG. 4 is a cross-sectional view of an organic electroluminescent display device according to another embodiment of the invention.

FIG. 4 is a cross-sectional view of an organic electroluminescent display device 440 according to another embodiment of the invention. Compared with the previously described embodiments, the main difference between the embodiments is thickness or height of the conductive layer. Specifically, the conductive layer according to this embodiment has a sufficient height or thickness for electrically connecting to and being in contact with the cathode of the organic electroluminescent unit without the conductive member. As such, formations and materials of the similar elements in this embodiment described in the above embodiments are not provided here for brevity.

In FIG. 4, a first substrate 402 is provided with a color filter layer 412 and a black matrix 404 formed thereon. A conductive layer 406 is formed on the first substrate 402 and surrounds the color filter layer 412 and the black matrix 404 to transmit an exterior signal to the organic electroluminescent display device. Note, that the conductive layer 406 has a sufficient height whereby the conductive layer 106 can electrically connect to and being in contact with the second electrode (cathode) 426 later formed.

Referring to FIG. 4, using a sealant 432, the first substrate 402 is correspondingly disposed on and is then sealed to a second substrate 414, which has an array of thin film transistors 418, a first electrode 420, an organic electroluminescent layer 424 and the second electrode 426 formed thereon. The first electrode 420 is electrically connected to the TFT 418 and the conductive layer 406 directly and electrically contacts with the second electrode 426 because of its sufficient height. Moreover, a conductive member 431 is between the substrates and electrically connects the conductive layer 406 to a bonding pad 416. For receiving the exterior signal, the bonding pad 416 is electrically connected to a flexible printed circuit 428.

Note that in the embodiment illustrated in FIG. 4, because the conductive layer 406 has the sufficient height capable of contacting the second electrode 426, the conductive layer 406 can directly and electrically be connected to the second electrode 426 without an additional conductive member. Moreover, because the height or thickness of the conductive layer 406 is increased, a distance between the conductive layer 406 and the bonding pad 416 is decreased. Accordingly, materials used for conductive members are decreased and fabrication costs are also reduced.

The organic electroluminescent display device 440, illustrated in FIG. 4, can also be used in the image display system as illustrated in FIG. 3. By coupling the organic electroluminescent display device 440 with the input unit, a signal is transmitted to the organic electroluminescent display device 440 to control the organic electroluminescent display device 440 for displaying images.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A system for displaying images, comprising:
    an organic electroluminescent display device, comprising:
        a first substrate comprising a pixel region and a non-pixel region;
        a conductive layer formed in the non-pixel region of the first substrate ;
        a second substrate disposed corresponding to the first substrate;
        a first electrode formed on the second substrate;
        an organic electroluminescent layer formed on the first electrode; and
        a second electrode formed on the organic electroluminescent layer and electrically connected to the conductive layer, wherein the second electrode has a flat surface corresponding to the pixel region and the non-pixel region of the first substrate; and
    an exterior circuit electrically connected to the conductive layer in the non-pixel region.

2. The system as claimed in claim 1, wherein the organic electroluminescent display device further comprises a black matrix formed in the pixel region.

3. The system as claimed in claim 2, wherein the black matrix comprises a conductive material.

4. The system as claimed in claim 2, wherein the black matrix and the conductive layer are located at the same substrate level.

5. The system as claimed in claim 1, wherein the organic electroluminescent display device further comprises a color filter layer disposed in the pixel region and surrounded by the conductive layer.

6. The system as claimed in claim 1, wherein the organic electroluminescent displayer device further comprises a first conductive member formed between the first substrate and the second substrate, and electrically connected the conductive layer and the second electrode.

7. The system as claimed in claim 6, wherein the organic electroluminescent display device further comprises a second conductive member disposed between the first substrate and the second substrate.

8. The system as claimed in claim 7, wherein the organic electroluminescent display device further comprises a bonding pad formed on the second substrate and electrically connected the second conductive member and the exterior circuit.

9. The system as claimed in claim 7, wherein the first conductive member and the second conductive member comprise a conductive resin.

10. The system as claimed in claim 7, wherein the first conductive member and the second conductive member comprise a conductive coating.

11. The system as claimed in claim 8, wherein the first conductive member and the second conductive member comprise an anisotropic conductive film for sealing the first substrate and the second substrate.

12. The system as claimed in claim 1, wherein the conductive layer comprises chromium, aluminum or nickel.

13. The system as claimed in claim 1, further comprising an electronic device comprising:
    the organic electroluminescent display device; and
    an input unit coupled with the organic electroluminescent display device ,wherein a signal is transmitted to the organic electroluminescent display device by the input unit for controlling the organic electroluminescent display device to display the images.

14. The system as claimed in claim 13, wherein the electronic device comprises mobile phones, digital cameras, personal digital assistants, notebook computers, desktop computers, televisions, automotive monitors, global positioning systems, fight display or portable digital video disc (DVD) players.

* * * * *